United States Patent [19]

Kim et al.

[11] Patent Number: 5,027,182

[45] Date of Patent: Jun. 25, 1991

[54] HIGH-GAIN ALGAAS/GAAS DOUBLE HETEROJUNCTION DARLINGTON PHOTOTRANSISTORS FOR OPTICAL NEURAL NETWORKS

[75] Inventors: Jae H. Kim, Arcadia; Steven H. Lin, Temple City, both of Calif.

[73] Assignee: The United States of America as represented by the Administrator of the National Aeronautics and Space Administration, Washington, D.C.

[21] Appl. No.: 596,133

[22] Filed: Oct. 11, 1990

[51] Int. Cl.$^5$ .................. H01L 27/02; H01L 29/161; H01L 33/00; H01L 29/72

[52] U.S. Cl. ............................ 357/46; 357/16; 357/17; 357/34; 357/30

[58] Field of Search ............... 357/46, 16, 34, 17, 357/30

[56] References Cited

U.S. PATENT DOCUMENTS

| | | | |
|---|---|---|---|
| 3,780,359 | 12/1973 | Dumke et al. | 317/235 |
| 4,137,428 | 1/1979 | Federico et al. | 179/1 |
| 4,160,258 | 7/1979 | Dawson et al. | 357/16 |
| 4,751,195 | 6/1988 | Kawai | 437/31 |
| 4,771,013 | 9/1988 | Curran | 437/31 |
| 4,771,326 | 9/1988 | Curran | 357/34 |
| 4,790,635 | 12/1988 | Apsley | 350/356 |
| 4,794,440 | 12/1988 | Capasso et al. | 357/34 |
| 4,821,082 | 4/1989 | Frank et al. | 357/34 |
| 4,897,622 | 1/1990 | Cheo et al. | 330/4.3 |
| 4,903,104 | 2/1990 | Kawai et al. | 357/35 |
| 4,916,499 | 4/1990 | Kawai | 357/22 |

OTHER PUBLICATIONS

J. Katz et al., "A Monolithic Integration of GaAs/ . . . ", Applied Physics Letters, 37(2), 211-213 (7/80).
H. Kroemer, "Heterostructure Bipolar Transistors . . . ", Proceedings of the IEEE, vol. 70, Jan. 1982, pp. 13-25.

Primary Examiner—Mark Prenty
Attorney, Agent, or Firm—Thomas H. Jones; Harold W. Adams; John R. Manning

[57] ABSTRACT

High-gain MOCVD-grown (metal-organic chemical vapor deposition) AlGaAs/GaAs/AlGaAs n-p-n double heterojunction bipolar transistors (DHBTs) (14) and Darlington phototransistor pairs (14, 16) are provided for use in optical neural networks and other optoelectronic integrated circuit applications. The reduced base (22) doping level used herein results in effective blockage of Zn out-diffusion, enabling a current gain of 500, higher than most previously reported values for Zn-diffused-base DHBTs. Darlington phototransistor pairs of this material can achieve a current gain of over 6,000, which satisfies the gain requirement for optical neural network designs, which advantageously may employ novel neurons (10) comprising the Darlington phototransistor pair in series with a light source (12).

22 Claims, 5 Drawing Sheets

HIGH-GAIN ALGAAS/GAAS DOUBLE HETEROJUNCTION DARLINGTON PHOTOTRANSISTORS FOR OPTICAL NEURAL NETWORKS

ORIGIN OF THE INVENTION

The invention described herein was made in the performance of work under a NASA contract, and is subject to the provisions of Public Law 96-517 (35 U.S.C. 202) in which the Contractor has elected not to retain title.

TECHNICAL FIELD

The present invention relates to optical neural networks, and, more particularly, to monolithically integrated two-dimensional arrays of optoelectronic neurons to be used for the implementation of optical neural networks.

BACKGROUND ART

The optical implementation of computing systems, whose structure and function are motivated by natural intelligence systems, would be a unique path to optical computing and to neural network models for computation. Electronic interconnects are becoming the bottleneck in the realization of neural networks and other globally interconnected systems. The heat dissipation and interconnection delay are also serious design performance limiting factors. One possible solution is to use free space optical interconnects as implemented, for example, in volume holograms recorded in photorefractive crystals. With optics, it is possible to have large arrays of processing elements communicating with one another without wire interconnections.

The optical implementation of a neural network consists of two basic components: neurons and interconnections. The neuron is an optical non-linear processing element (e.g., threshold unit) that can be implemented by a single switching device. The practical neural computer may require millions of neurons operating in parallel. Each neuron accepts inputs from other neurons and produces a single output that is connected to many other neurons, typically several thousands. Hence, the number of interconnections in a network is much larger than the number of neurons. While this massive connectivity is relatively difficult to achieve electronically, optics is a practical means which is suitable for the realization of interconnects. This fact provides the main motivation for considering the optical implementation of neural networks.

Several emerging optical technologies have been considered for the realization of neural networks: spatial light modulators (SLMs), integrated optoelectronics, and arrays of non-linear optical switches.

SLMs have been investigated primarily for optical image processing. However, practical, useful devices are not yet available except for laboratory experiments.

The arrays of non-linear optical switches are intended either for optical communications or digital optical computing. The major problem with these arrays is the high power required to switch each element and the sensitivity of their operation to environmental conditions.

One of the most promising implementation technology appears to be optoelectronics. The optoelectronic approach to simulating an array of neurons involves monolithic integration of two-dimensional (2-D) arrays of photodetectors and light sources on a single chip. The output of each detector is connected to the corresponding light source via a saturating amplifier or an appropriate analog circuit that performs the required non-linear mapping. Light emitted from a particular neuron may be diffracted to many other neurons in a programmable fashion by gratings written in holographic optical elements, as an example. The only electrical connection would be the power and the global bias to optoelectronic integrated circuits (OEICs).

Since one of the requirements for a neuron is a detector and a saturating amplifier, a double heterojunction phototransistor (DHPT) is a likely candidate because of its structural compatibility with laser diodes and light emitting diodes (LEDs) and its ability to detect light and to provide high gain in compensating for the losses incurred in the holographic portion of the system. Assuming a detector efficiency of 0.4 A/W, a LED efficiency of 0.01 W/A to be used as the light source, and a hologram diffraction efficiency of 10%, the requirement that the loop gain of the system must be at least 1 implies that the transistor must provide a current gain of at least 2,500. To achieve this, high-gain double heterojunction bipolar transistors (DHBTs) must be developed.

Integration of a double heterostructure bipolar transistor and an injection laser is known; see, e.g., J. Katz et al, "A Monolithic Integration of GaAs/AlGaAs Bipolar Transistor and Heterostructure Laser", Applied Physics Letters, Vol. 37, pp. 211-213 (1980). No disclosure or suggestion as to use in neural networks is made, however.

There remains a need for integration of a high-gain double heterojunction phototransistor and a light source for use in constructing neurons for implementation of optical neural networks.

STATEMENT OF THE INVENTION

Accordingly, it is an object of the invention to provide a high-gain double heterojunction phototransistor. To achieve a high-gain phototransistor, a Darlington phototransistor pair combining a DHBT and a DHPT is used in the invention.

It is an additional object of the invention to integrate such a high-gain Darlington phototransistor pair with a light source, such as a diode laser or LED, to form a neuron for use in optical neural networks.

In accordance with the invention, a current gain of 500 in a single DHBT and a combined gain of over 6,000 in a Darlington DHPT have been achieved to meet the gain requirement for the optical neural network design described above.

The current gain of 500, higher than most of the previously reported values for Zn-diffused-base DHBTs, is achieved through elimination of the inevitable and well-known out-diffusion of the dopant (typically zinc or beryllium) from the base. Employing reduced base doping, together with inserting undoped spacer layers at both junction interfaces and maintaining a relatively high growth temperature for optical quality of the crystal, permit the fabrication of high-gain DHBTs for monolithic integration with light sources to form the neurons for neural networks.

This high-gain AlGaAs/GaAs/AlGaAs n-p-n double heterojunction bipolar transistor, grown by metalorganic chemical vapor deposition (MOCVD), has the following characteristics useful for neural network applications. A common-emitter current gain of 500 with an emitter area of $2.4 \times 10^{-4}$ cm$^2$ and a base layer thickness of 0.15 μm was obtained at a collector current density of 500 A/cm$^2$. A combined current gain of 6,000 was observed in a Darlington DHPT. The reduced base doping level incorporated in these devices has resulted in an effective blockage of Zn out-diffusion as well as an improvement in the current gain of the DHBTs.

DETAILED DESCRIPTION OF THE INVENTION

Two-dimensional arrays of $10 \times 10$ monolithically integrated optoelectronic threshold elements (optical neurons) have been developed for optical neural network applications. The description which follows below is directed to the optical neurons and their structure.

Figure 1:
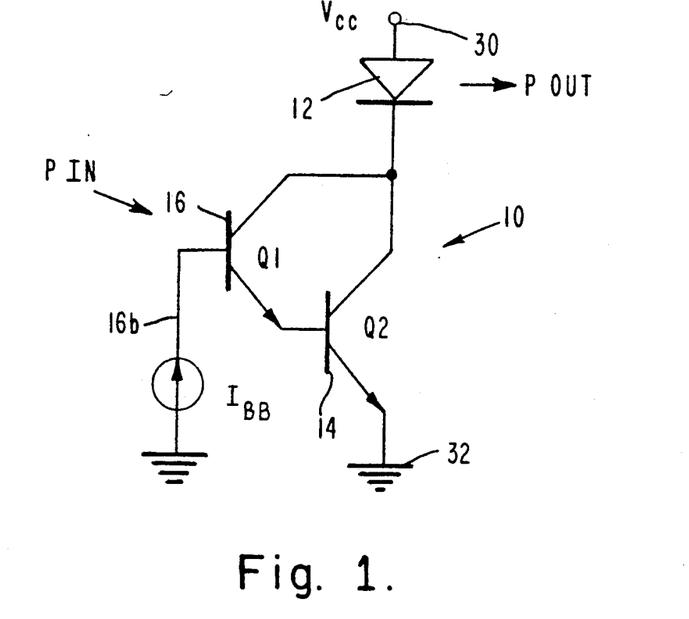
FIG. 1 is an equivalent circuit of each neuron of the invention.

Referring now to the drawings, wherein like numerals of reference designate like elements throughout, FIG. 1 depicts the equivalent circuit of each neuron 10 in accordance with the invention. Each optical neuron 10 consists of a light emitting diode (LED) or a laser 12 driven by a double heterojunction bipolar transistor (DHBT) 14 which is in turn driven by the output of a double heterojunction phototransistor (DHPT) 16. As an example, a $10 \times 10$ 2-D array of optical neurons has dimensions of $5 \times 5$ mm$^2$ and each neuron 10 has dimensions of $250 \times 250$ μm$^2$. The light-emitting area of the LED 12 has dimensions of $8 \times 8$ μm$^2$. The light-detecting area of the DHPT 16 has dimensions of $50 \times 130$ μm$^2$.

Light from one or more neurons in the array ($P_{IN}$) is diffracted by a holographic optical element (not shown) and is detected by DHPTs 16 and is amplified by the Darlington pairs of bipolar phototransistors 16 and 14 to drive the light sources 12. The light output ($P_{OUT}$) is then directed to one or more other neurons in the array.

Figure 2A:
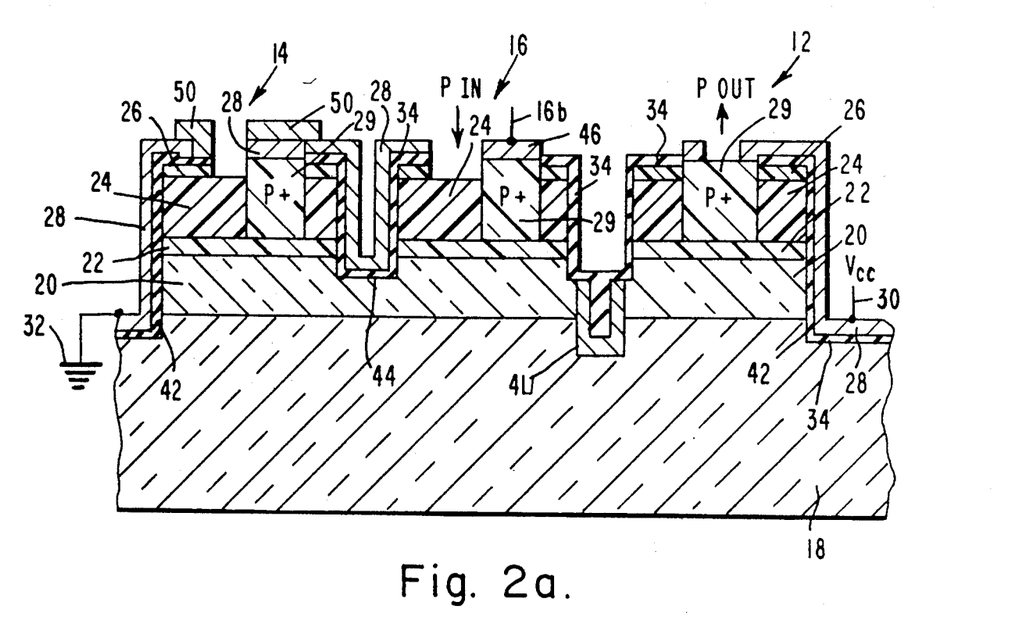
FIG. 2a, in cross-section, depicts the structure of each neuron.
Figure 2B:
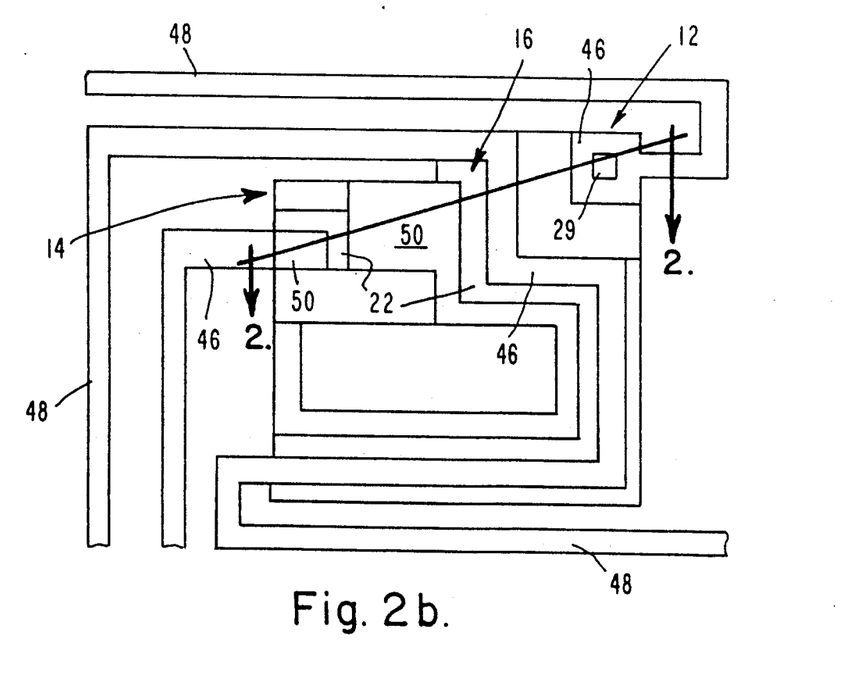
FIG. 2b kis a top-plan view of the layout of the fabricated single neuron, showing interconnections to adjacent neurons.

The current on the base of Q1 (DHPT 16) may be from a constant source or from a variable source $I_{BB}$. The latter, by permitting adjustment of the base current, allows adjustment of the output current level of the light source Several such arrays have been fabricated on GaAs substrates. The cross-sectional structure of each neuron 10 is shown in FIG. 2a. The layout of the fabricated single neuron is shown in FIG. 2b. Generally speaking, the three elements (light source 12, DHBT 14, and DHPT 16) are formed on the same substrate 18, which comprises semi-insulating GaAs. Four essential layers are formed sequentially thereon, although as will be shown below, additional layers are provided for specific functions. The first layer 20 comprises n-AlGaAs; the second layer 22 comprises p-GaAs; the third layer 24 comprises n-AlGaAs; and the fourth layer 26 comprises n+-GaAs. Conducting contacts 28 are provided for connection to the supplied voltage ($V_{cc}$) 30, ground 32, and between adjacent elements. A p+ layer 29 provides electrical connection between the conducting contacts 28 and the base layer 22. An insulating layer 34, such as silicon nitride ($Si_3N_4$), serves as the mask for the selective Zn-diffusion as well as insulates the contacts from the various semiconductor layers. A thickness of about 1,000 to 1,500 Å of $Si_3N_4$ is necessary to effectively eliminate the permeability of Zn through layer 34.

Figure 3:
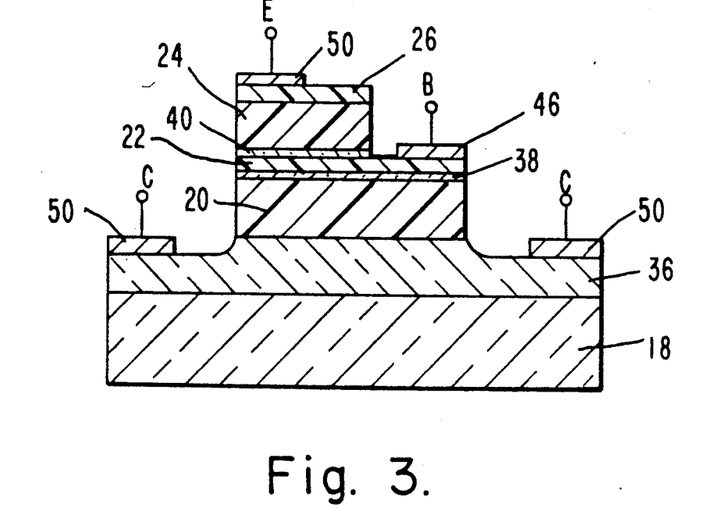
FIG. 3, in cross-section, depicts the device structure of an $Al_xGa_{1-x}As/GaAs/Al_xGa_{1-x}As$ double heterostructure bipolar transistor employed in the practice of the invention.

As an example, depicted in FIG. 3, double heterojunction (DH) structures have been epitaxially grown on (100) Cr-doped semi-insulating GaAs substrates (resistivity $\approx 5 \times 10^7$ Ω-cm) by metal-organic chemical vapor deposition (MOCVD). According to doping profile measurements by an electrochemical cell, DH layers consist of: Si-doped ($2 \times 10^{18}$ to $5 \times 10^{16}$ cm$^{-3}$) n-GaAs buffer layer 36, 0.5 to 1.0 μm; Si-doped ($5 \times 10^{16}$ to $5 \times 10^{17}$ cm$^{-3}$) n-$Al_{0.3}Ga_{0.7}As$ collector (or lower cladding) layer 20, 0.6 to 1.0 μm; undoped GaAs spacer layer 38, 100 to 300 Å; Zn-doped ($2 \times 10^{17}$ to $5 \times 10^{17}$ cm$^{-3}$) p-GaAs base (or active) layer 22, 0.1 to 0.3 μm; undoped GaAs spacer layer 40, 100 to 300 Å; Si-doped ($2 \times 10^{17}$ to $5 \times 10^{17}$ cm$^{-3}$ n-$Al_{0.3}Ga_{0.7}As$ emitter (or upper cladding) layer 24, 0.3 to 1.0 μm; and Si-doped ($2 \times 10^{18}$ to $1 \times 10^{19}$ cm$^{-3}$) n+-GaAs cap layer 26, 0.1 to 0.2 μm. It will be appreciated that the spacer layers 38 and 40 have been omitted from FIG. 2a, in the interests of clarity. However, these spacer layers are present in each of the three elements 12, 14, and 16.

The thickness of the base layer 22 is designed as a compromise between high current gain for the transports and adequate photoresponse of the phototransistor. In structures fabricated with two steps of epitaxial growth, these parameters can be separately optimized. Since the emitter injection efficiency is enhanced by the large band gap discontinuities which effectively block the back-injection of carriers into the emitter, the current gain is relatively independent of the doping ratio of the emitter and base layers 24 and 22, respectively. Therefore, the emitter 24 can be lightly doped to reduce the emitter-base junction capacitance and the base 22 can be heavily doped to minimize the spreading resistance and contact resistance of the base layer. This reduces the amount of current crowding and eliminates possible punch-through at the reverse-biased collector-base junction. The collector buffer layer 36 may be heavily doped so that the collector resistance can be reduced without affecting device performance.

However, an additional issue to be considered is the sensitivity of the base doping profile to growth temperature. In particular, the inevitable dopant (e.g., Zn or Be) out-diffusion during high temperature growth may shift the emitter-base junction into the AlGaAs layer 24.

To avoid this problem, a reduction in the base doping concentration in the structure depicted in FIG. 3 was employed as opposed to a reduction in the growth temperature. This is because a lower growth temperature would create more undesirable non-radiative recombination centers in the light sources that are monolithically integrated with the DHBTs. The base doping is preferably maintained in the region of about $2 \times 10^{17}$ to $5 \times 10^{17}$ cm$^{-3}$. Since reducing the base doping concentration may result in a slight increase in the base resistance, the speed of the transistors would be expected to be reduced. However, a switching time on the order of $\mu$sec is sufficient for the neural network. Thus, a reduction in the base doping concentration would not adversely affect the speed of the network. Moreover, the reduction in the base doping concentration will increase the current gains of the transistors along with the minority carrier lifetime in the base, as is known; see, e.g., H. Kroemer, "Heterostructure bipolar transistors and integrated circuits", Proceedings of the IEEE, Vol. 70, pp. 13-25 (1982).

The spacer layer 40 with optimized thickness also helps to properly place the emitter-base junction at the heterointerface. In addition, the zinc-diffusion front should be controlled so that it is located within the GaAs base layer 22.

Testing of the integrated structure has initially revealed p-n-p-n characteristics. This parasitic effect has been completely solved. The details are as follows: The parasitic p-n-p transistor, whose emitter is the Zn-diffused region 22 in the LED 12 and collector is the base region 22 in the DHPT 16, exists because the LED and the Darlington phototransistor pair 14, 16 are connected by the common AlGaAs collector layer 20. The gain of this parasitic transistor may be degraded by separating the LED and the Darlington transistor pair farther apart. However, this approach may require a rather large chip area, which is not suitable for large arrays, and further may not guarantee the complete removal of the parasitic transistor. Preferably, the parasitic p-n-p transistor may be eliminated by isolating all devices electrically and then employing metalization to connect them as required.

To eliminate the parasitic p-n-p transistor existing between the light source (LED) 12 and the Darlington phototransistor pair 14, 16, a groove is etched into the semi-insulating substrate 18 to isolate the LED from the Darlington phototransistor pair, and metallization 41 (Au-Ge/Ni/Au) is employed to connect them as required, as depicted in FIG. 2a. The insulator layer 34 fills in any gaps.

The neuron array fabrication procedure is as follows. Following the post-growth wafer cleaning procedure, the first non-selective etching (denoted by numeral 42 in FIG. 2) of a GaAs/AlGaAs double heterostructure layer into the semi-insulating GaAs substrate is done for isolation between the individual neuron cells 10. The etching solution of H$_3$PO$_4$+H$_2$O$_2$+CH$_3$COOH (1:1:3) is used to minimize undercut. (The maximum undercut allowance herein is 5 $\mu$m, although this value may differ for specific applications). The second non-selective chemical etching (denoted by numeral 44 in FIG. 2) provides device isolation between DHBT 14, DHPT 16, and LED 12 in each neuron 10. Following the etching steps, a silicon nitride layer 34 about 1,000 to 1,500 Å thick is deposited by thermal chemical vapor deposition, such as at 680° C., and then the regions to be Zn-diffused are opened by plasma etching of the Si$_3$N$_4$ layer. Zinc is selectively diffused at 650° C. for 45 min down to the p-GaAs base layer 22 using a high purity zinc arsenide (ZnAs$_2$) source by the sealed ampoule technique. The photosensitive areas of DHPTs 16 are then opened by plasma etching of the Si$_3$N$_4$ layer 34. Ti/Au layers are evaporated for p-type ohmic contacts 46 and interconnection lines 48 shown in FIG. 2b. For n-type ohmic contacts 50 and groove interconnect metals 41, Au-Ge/Ni/Au layers are deposited and alloyed at 400° to 420° C., after which the fabrication of two-dimensional arrays of monolithic integrated optoelectronic threshold elements (optical neurons) is complete.

Figure 7:
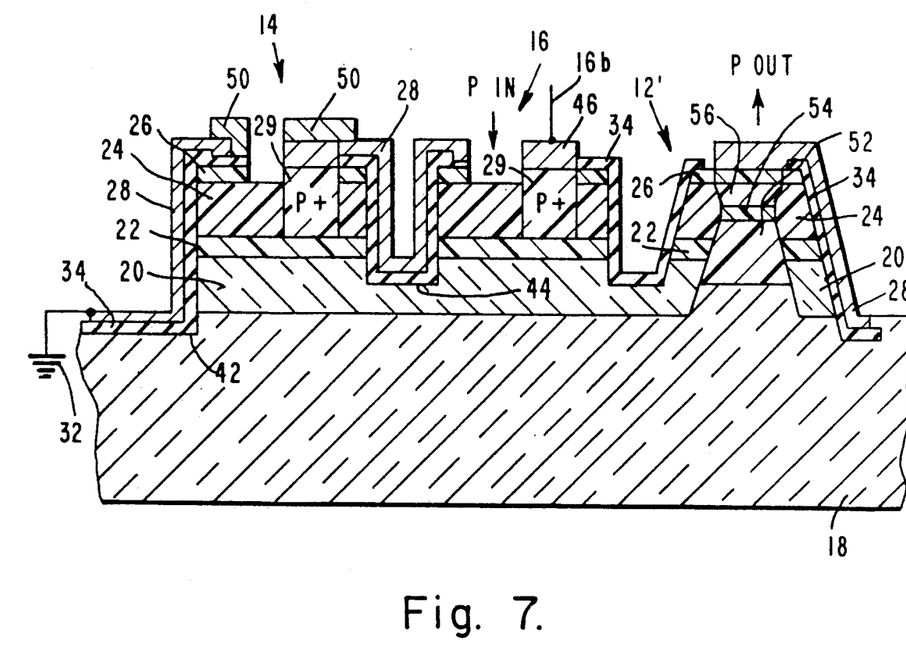
FIG. 7, in cross-section, depicts the structure of a neuron shown in FIG. 2, replacing the LED with a surface-emitting laser diode as the light source.

A laser diode 12', may be employed in place of the LED 12. Such a structure is shown in FIG. 7. The only change from the structure depicted in FIG. 2a is the buried heterostructure (BH) laser, which comprises a buried region of a first layer of n-AlGaAs 52, a second layer of GaAs 54, and a third layer of p-AlGaAs 56. This buried region may be grown prior to formation of the several layers of the remaining elements and etched to leave a mesa-like structure, around which the other layers are regrown. The compositions of the various layers of the BH-laser and their thickness are those already known in the art.

While the laser shown is a surface-emitting laser, edge-emitting lasers can be employed in the invention, with appropriate means to couple the light in the vertical direction to communicate between neurons through holographic optical elements.

EXAMPLE

The double heterojunction structure was epitaxially grown on (100) Cr-doped semi-insulating GaAs substrates (resistivity ($\rho$) $\geq 5 \times 10^7$ ohm-cm) by metal-organic chemical vapor deposition. The GaAs and AlGaAs layers were grown by trimethyl gallium (TMG), trimethyl aluminum (TMA), and 10% arsine (AsH$_3$) in 90% H$_2$. Zinc and silicon were used for p- and n-type dopants, respectively. The substrate temperature during growth was about 730° C.

The DHBT structure consisted of: 0.5 $\mu$m of Si-doped $10^{18}$ cm$^{-3}$ n-GaAs subcollector/buffer, 1.2 $\mu$m of Si-doped ($1.6 \times 10^{17}$ cm$^{-3}$) n-Al$_{0.3}$Ga$_{0.7}$As collector, 100 jÅ of GaAs undoped spacer layer, 0.15 $\mu$m of Zn-doped ($2 \times 10^{17}$ cm$^{-3}$) p-GaAs base, 100 Å of GaAs undoped spacer layer, 1.0 $\mu$m of Si-doped ($4.2 \times 10^{17}$ cm$^{-3}$) n-Al$_{0.3}$Ga$_{0.7}$As emitter, and 0.23 $\mu$m of Si-doped ($1.5 \times 10^{18}$ cm$^{-3}$) n-GaAs cap layer. The doping profile and thickness of each DHBT layer were plotted by a Polaron PN-4200 electrochemical profiler, which showed that the doping concentration of each layer was very uniform.

Figure 4:
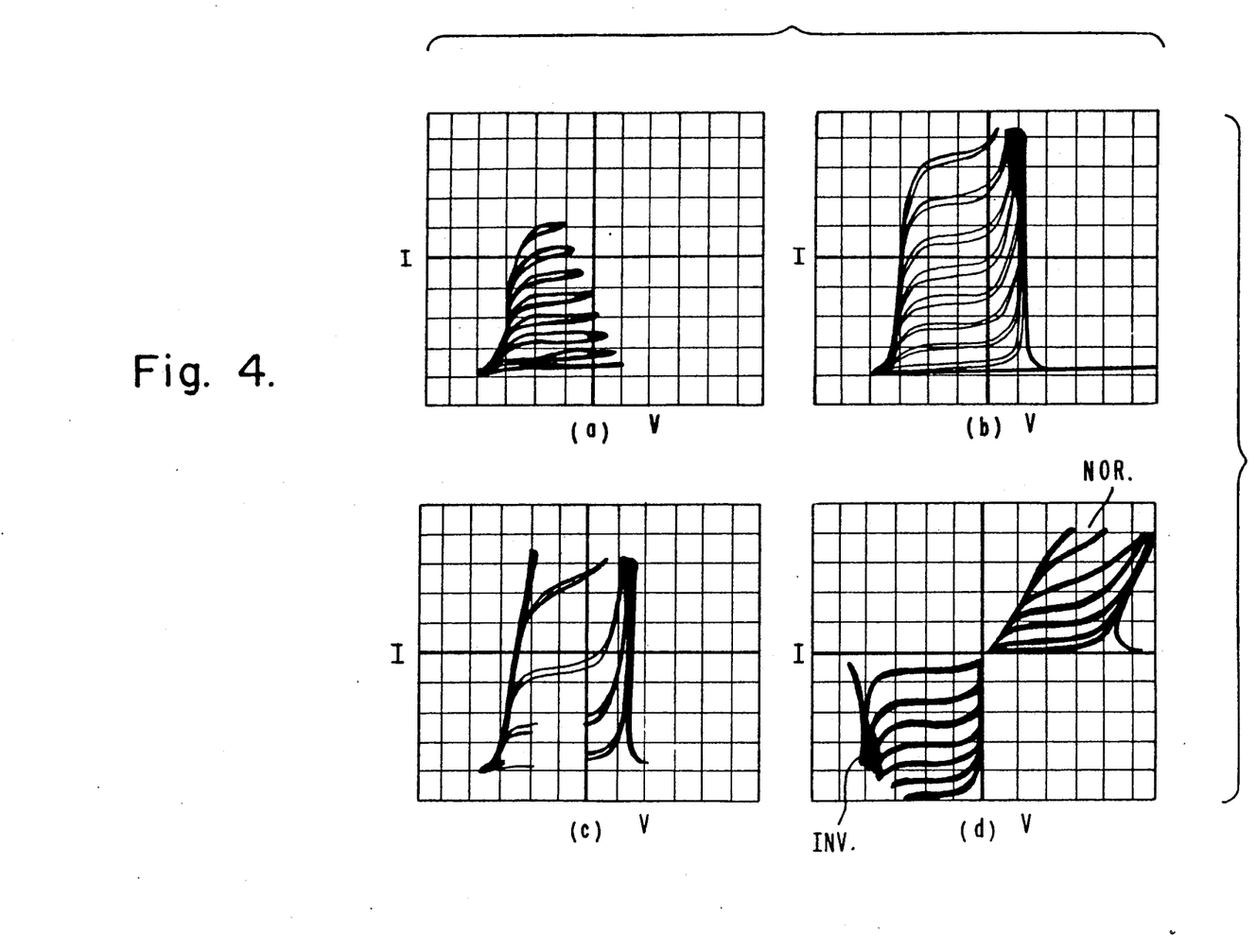
FIGS. 4a–d, on coordinates of current (I) and voltage (V), are I–V plots of the common-emitter current characteristics of the DHBT of the invention at: (a) low current levels; (b) normal current levels; (c) high current levels; and (d) normal and inverted modes, showing a current gain of 500.

Test results of DHBTs are as follows. Typical common-emitter current characteristics are shown in FIGS. 4a-d at several different current levels. Current gains of 40, 100, 300, and 500 were obtained at collector currents of 0.2, 10, 70, and 120 mA, respectively, as shown in FIG. 4a, 4b, 4c, and 4d. FIG. 4a is at 0.05 mA/div, 0.5 V/div, 1.0 $\mu$A/step; FIG. 4b is at 2.0 mA/div, 1.0 V/div, 0.02 mA/step; and FIG. 4c is at 10 mA/div, 1.0 V/div, 0.1 mA/step. FIG. 4d shows both the normal-mode (NOR) and the inverted-mode (INV) DHBT characteristics with a current gain of 10 at an emitter current of 2 mA. FIG. 4d (NOR) is at 40 mA/div, 1.0 V/div, 0.1 mA/step, while FIG. 4d (INV) is at 1.0 mA/div, 1.0 V/div, 0.1 mA/step. The forward I-V characteristics showed an offset voltage of 0.3 V. However, no offset voltage was observed in the inverted mode. Reverse breakdown voltages of 8 and 10 volts were observed for the emitter-base and collector-base junctions, respectively. The collector-emitter breakdown voltage ($BV_{CBO}$) in the common-emitter configuration was 5 V. The collector current density at which the current gain of 500 was obtained was 500 A/cm$^2$ based on the base-emitter junction area of 2.4 ×10$^{-4}$ cm$^2$, as also shown in FIG. 4d (NOR).

Figure 5:
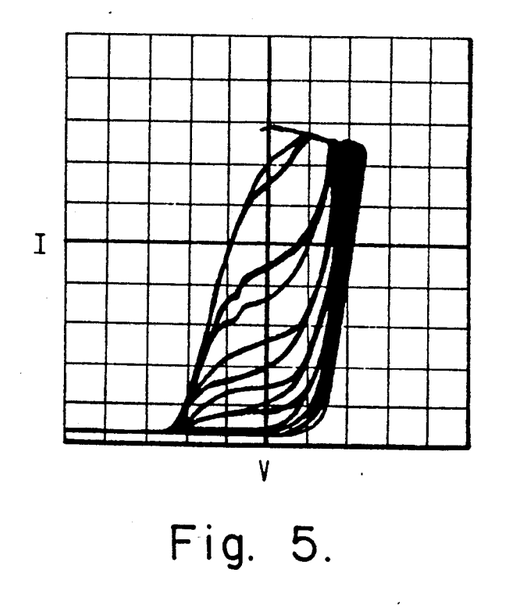
FIG. 5, on coordinates of current (I) and voltage (V), is an I–V plot of the common-emitter current characteristics for a Darlington DHPT, which exhibited a combined current gain of 6,000.

To obtain the current gain required for a neural network as described earlier, Darlington DHPTs were also tested and were observed to exhibit a combined current gain of 6,000, as shown in FIG. 5. FIG. 5 is at 1 V/div, 5 mA/div, 2 μA/step.

Figure 6:
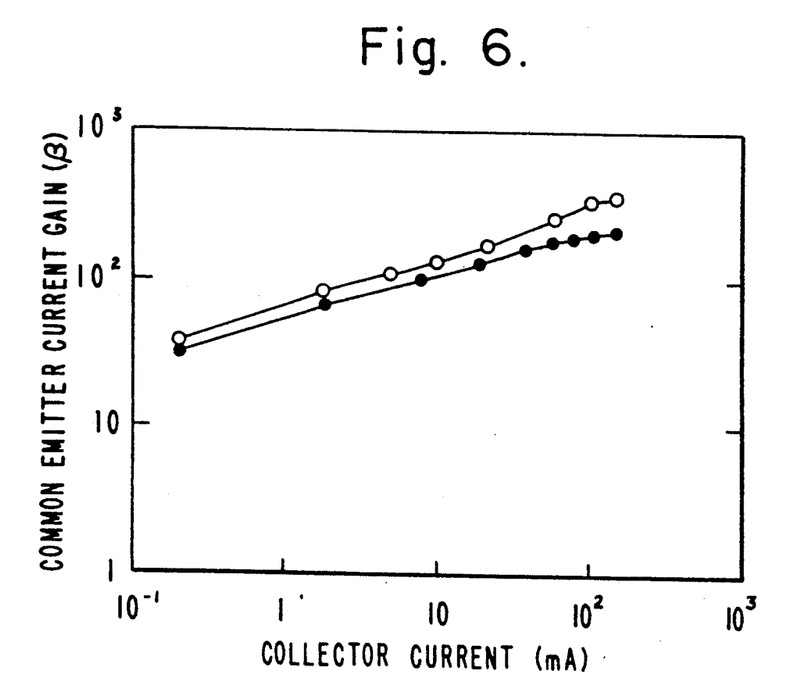
FIG. 6, on coordinates of gain ($\beta$) and current (I), is a logarithmic $\beta$-I plot of the measured common-emitter current gain for a single DHBT as a function of the collector current at $V_{CE}=3$ and 4.5 V. The ideality factor was evaluated to be approximately 1.4.

FIG. 6 shows the logarithmic plot of the measured common-emitter current gain for a single DHBT as a function of the collector current. The ideality factor (n) evaluated from the relation $\beta \approx I^{1-1/n_o}$ was approximately 1.4, which indicated that the recombination current in the emitter-base junction depletion region was small. It should be noted that the current gain increased continuously with increasing collector current. This implies that no serious base widening or emitter crowding effect was present.

Thus, there has been disclosed an optical neuron structure for use in optical neural networks, together with a novel Darlington heterojunction bipolar phototransistor pair for use in such a neuron structure. Many changes and modifications of an obvious nature may be made, and all such changes and modifications are considered to fall within the scope of the invention as defined by the appended claims.

We claim:

1. A neuron for optical neural networks comprising a Darlington double heterojunction phototransistor pair connected in series with a light source, said Darlington double heterojunction phototransistor pair comprising a double heterojunction bipolar transistor and a double heterojunction phototransistor pair.

2. The neuron of claim 1 wherein said light source comprises a laser diode.

3. The neuron of claim 1 wherein said light source comprises a light emitting diode.

4. The neuron of claim 1 comprising in series said light source driven by said double heterojunction bipolar transistor which in turn is driven by said double heterojunction phototransistor.

5. An array of optical neurons for optical neural networks, each optical neuron comprising a Darlington double heterojunction phototransistor pair connected in series with a light source, said Darlington double heterojunction phototransistor pair comprising a double heterojunction bipolar transistor and a double heterojunction phototransistor, each optical neuron arranged such that light from at least one light source of at least one neuron in said array is detected by another neuron and such that light from at least one neuron in the array is detected by the phototransistor of at least one other neuron in said array.

6. The array of claim 5 wherein said light source comprises a laser diode.

7. The array of claim 5 wherein said light source comprises a light emitting diode.

8. The array of claim 5 wherein each of said neurons comprises in series said light source driven by said double heterojunction bipolar which in turn is driven by said double heterojunction phototransistor.

9. A Darlington double heterojunction phototransistor having high gains exceeding 6,000 comprising:
    (a) a semi-insulating GaAs substrate;
    (b) a GaAs buffer layer formed thereon having a first conductivity;
    (c) an AlGaAs collector layer formed on said buffer layer having said first conductivity;
    (d) a GaAs base layer formed on said collector layer having a second conductivity;
    (e) an AlGaAs emitter layer formed on said base layer having said first conductivity;
    (f) a heavily doped GaAs cap layer formed on said emitter layer having said first conductivity; and
    (g) conducting contacts to said collector, base, and emitter layers,
    characterized in that undoped GaAs spacer layers are interposed between said collector and said base layers, and between said base and said emitter layers.

10. The transistor of claim 9 wherein the thickness of said undoped spacer layers is about 100 to 300 Å.

11. The transistor of claim 9 wherein said buffer layer is doped with silicon to a level of about $2 \times 10^{18}$ to $5 \times 10^{18}$ cm$^{-3}$ and has a thickness of about 0.5 to 1.0 μm.

12. The transistor of claim 9 wherein said collector layer consists essentially of Al$_x$Ga$_{1-x}$As, where x is about 0.3, doped with silicon to a level of about $5 \times 10^{16}$ to $5 \times 10^{17}$ cm$^{-3}$ and has a thickness of about 0.6 to 1.0 μm.

13. The transistor of claim 9 wherein said base layer is doped with zinc to a level of about $2 \times 10^{17}$ to $5 \times 10^{17}$ cm$^{-3}$ and has a thickness of about 0.1 to 0.3 μm.

14. The transistor of claim 9 wherein said emitter layer consists essentially of Al$_x$Ga$_{1-x}$As, where x is about 0.3, doped with silicon to a level of about $2 \times 10^{17}$ to $5 \times 10^{17}$ cm$^{-3}$ and has a thickness of about 0.3 to 1.0 μm.

15. The transistor of claim 9 wherein said cap layer is doped with silicon to a level of about $2 \times 10^{18}$ to $1 \times 10^{19}$ cm$^{-3}$ and has a thickness of about 0.1 to 0.2 μm.

16. A process for fabricating a Darlington pair comprising a double heterojunction bipolar transistor and a double heterojunction phototransistor having a high gain exceeding 6,000 comprising:
    (a) a semi-insulating GaAs substrate;
    (b) a GaAs buffer layer formed thereon having a first conductivity;
    (c) an AlGaAs collector layer formed on said buffer layer having said first conductivity;
    (d) a GaAs base layer formed on said collector layer having a second conductivity;
    (e) an AlGaAs emitter layer formed on said base layer having said first conductivity;
    (f) a heavily doped GaAs cap layer formed on said emitter layer having said first conductivity; and
    (g) conducting contacts to said collector, base, and emitter layers,
    wherein undoped GaAs spacer layers are formed between said collector and said base layers, and between said base and said emitter layers.

17. The process of claim 16 wherein said undoped spacer layers are formed to a thickness of about 100 to 300 Å.

18. The process of claim 16 wherein said buffer layer is doped with silicon to a level of about $2 \times 10^{18}$ to $5 \times 10^{18}$ cm$^{-3}$ and is formed to a thickness of about 0.5 to 1.0 μm.

19. The process of claim 16 wherein said collector layer consists essentially of Al$_x$Ga$_{1-x}$As, where x is about 0.3, doped with silicon to a level of about $5 \times 10^{16}$ to $5 \times 10^{17}$ cm$^{-3}$ and is formed to a thickness of about 0.6 to 1.0 μm.

20. The process of claim 16 wherein said base layer is doped with zinc to a level of about $2 \times 10^{17}$ to $5 \times 10^{17}$ cm$^{-3}$ and is formed to a thickness of about 0.1 to 0.3 μm.

21. The process of claim 16 wherein said emitter layer consists essentially of Al$_x$Ga$_{1-x}$As, where x is about 0.3, doped with silicon to a level of about $2 \times 10^{17}$ to $5 \times 10^{17}$ cm$^{-3}$ and is formed to a thickness of about 0.3 to 1.0 μm.

22. The process of claim 16 wherein said cap layer is doped with silicon to a level of about $2 \times 10^{18}$ to $1 \times 10$ cm$^{-3}$ and has a thickness of about 0.1 to 0.2 μm.

* * * * *